United States Patent [19]

Bhat

[11] Patent Number: 5,288,327
[45] Date of Patent: Feb. 22, 1994

[54] DEFLECTED FLOW IN CHEMICAL VAPOR DEPOSITION CELL

[75] Inventor: Rajaram Bhat, Red Bank, N.J.

[73] Assignee: Bell Communications Research, Inc., Livingston, N.J.

[21] Appl. No.: 108,779

[22] Filed: Aug. 18, 1993

Related U.S. Application Data

[63] Continuation of Ser. No. 849,973, Mar. 12, 1992, abandoned.

[51] Int. Cl.$^5$ ............................................. C23C 16/00
[52] U.S. Cl. ..................................... 118/719; 118/715; 118/725; 156/613
[58] Field of Search ...................... 118/715, 719, 725; 156/613

[56] References Cited

U.S. PATENT DOCUMENTS

| | | | |
|---|---|---|---|
| 3,717,439 | 2/1973 | Sakai | 118/725 |
| 4,649,859 | 3/1987 | Wanlass | 118/715 |
| 4,897,149 | 1/1990 | Suzuki | 156/613 |
| 5,000,113 | 3/1991 | Wang | 118/723 |
| 5,045,496 | 9/1991 | Hess | 156/613 |

FOREIGN PATENT DOCUMENTS

| | | | |
|---|---|---|---|
| 2908851 | 9/1979 | Fed. Rep. of Germany | 156/613 |
| 3715644 | 1/1988 | Fed. Rep. of Germany | . |
| 57-48226 | 3/1982 | Japan | 156/345 |
| 61-136682 | 6/1986 | Japan | . |
| 2-30119 | 1/1990 | Japan | 118/715 |

OTHER PUBLICATIONS

IBM Tech. Dis. Bul. vol. 14, No. 9(Feb. 1972).
E. J. Thrush et al., "MOCVD grown InP/InGaAs structures for optical receivers," *Journal of Crystal Growth*, 1988, vol. 93, pp. 870–876.
J. van de Ven et al., "Gas phase depletion and flow dynamics in horizontal MOCVD reactors," *Journal of Crystal Growth*, 1986, vol. 76, pp. 352–372.
Aixtron's "Low-Pressure MOVPE: Concepts for Improved Quality and Safety," *III—Vs Review*, 1991, vol. 4, pp. 1, 3, 32, and 33.

*Primary Examiner*—Richard Bueker
*Attorney, Agent, or Firm*—Leonard Charles Suchyta; James W. Falk

[57] ABSTRACT

A reactor cell for use in organo-metallic chemical vapor deposition (OMCVD). Multiple precursor gases are combined in a supply tube (14). A deflector section (56) connected to the supply tube consists of three tubes (58, 60, 61) joined at right angles to each other and to the supply tube in order to maximize the turbulence in the gas flow and to thereby uniformly mix the gas. The last of the three tubes is perpendicularly joined to a tapered section (30) of rectangular cross-section that tapers outwardly toward a deposition chamber (22) of rectangular cross section containing a heated susceptor (18) holding the wafer (20) over which the uniformly mixed gas flows and cracks, thereby epitaxially depositing some of its constituents on the wafer.

4 Claims, 4 Drawing Sheets

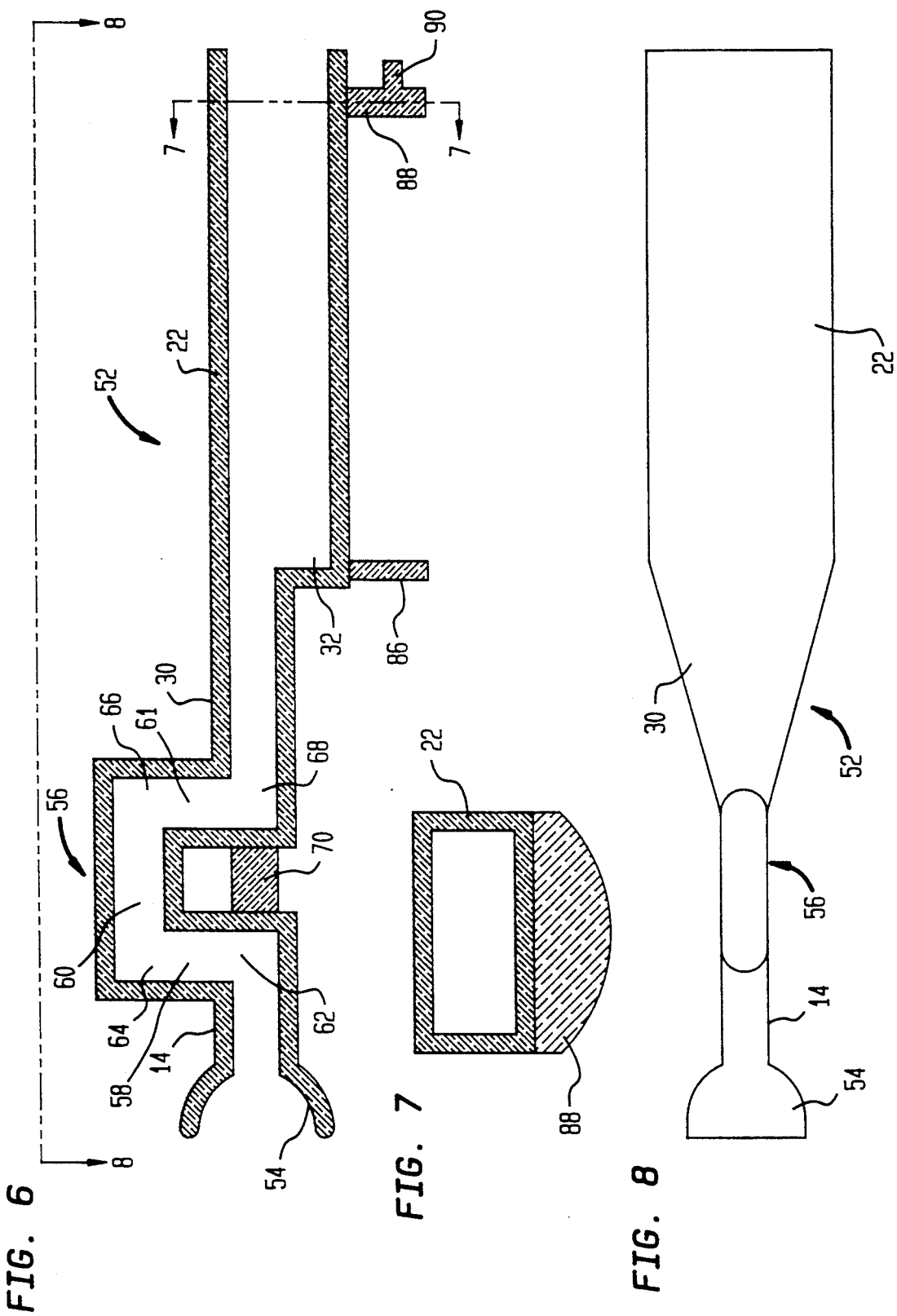

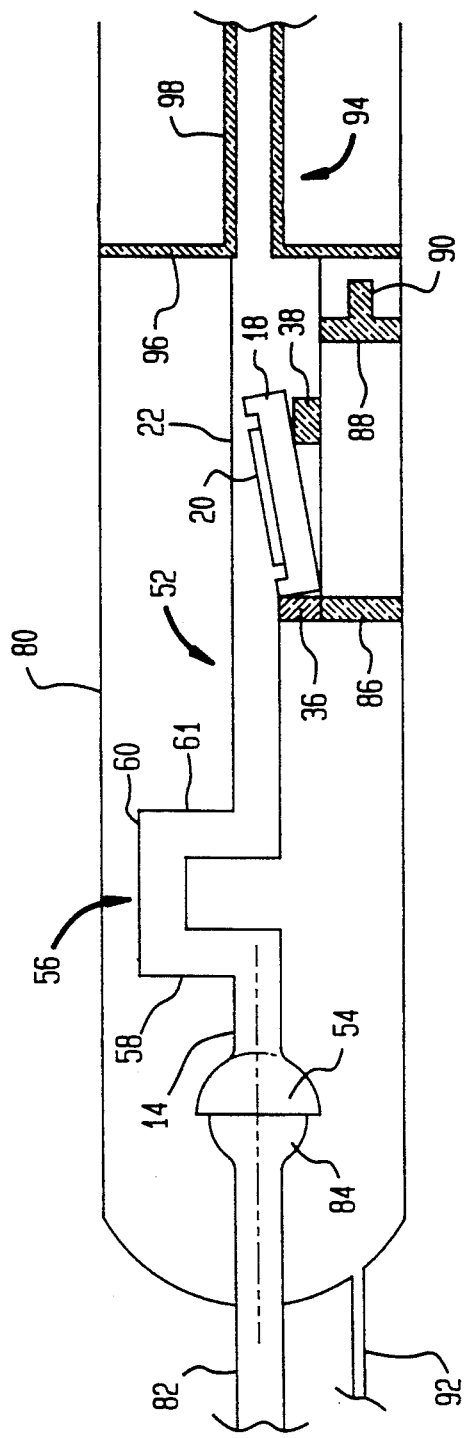

DEFLECTED FLOW IN CHEMICAL VAPOR DEPOSITION CELL

This application is a continuation of application Ser. No. 07/849,973, filed Mar. 12, 1992.

FIELD OF THE INVENTION

The invention relates generally to the growth of materials such as semiconductors. In particular, it relates to epitaxial growth by a process of chemical vapor deposition, especially organo-metallic chemical vapor deposition.

BACKGROUND ART

Several different processes can be used to grow epitaxial layers of compound semiconductors and other materials. Chemical vapor deposition (CVD) enjoys great commercial importance because it grows layers relatively quickly and involves relatively inexpensive growth apparatus compared to molecular beam epitaxy (MBE). In CVD, one or more chemical species, each bearing an element to be incorporated into the grown material, flow in a gaseous phase over a heated wafer. The chemical species react at the surface, and the growth elements recombine on the wafer in the desired composition. For the growth of silicon, silane ($SiH_4$) is the silicon precursor, and other precursors can be used for dopants, for example, phosphine ($PH_3$) and arsine ($AsH_3$) for the n-type dopants P and As. Vapor phase epitaxy (VPE) is an alternate name for CVD, which emphasizes that the new material can be grown to be epitaxial with the underlying wafer.

The interest in high-speed electronics and opto-electronics has prompted much research and development in the epitaxial growth of compound semiconductors such as GaAs and InP. These compound materials involve some somewhat exotic materials for which simple gaseous metal-hydride chemical precursors are not readily available. Furthermore, many interesting compound-semiconductor devices require the growth of exceedingly thin layers or of very abrupt junctions, of the order of manometers to tens of nanometers. MBE can satisfy most of these requirements although it cannot be used for P because the many forms of P prevents accurate control of its vapor pressure. The technology for CVD is thus desirable both for InP and for commercial environments demanding high production rates.

In organo-metallic chemical vapor deposition (OMCVD), at least some of the chemical precursors have a more complicated, organic form. For instance, for the growth of GaAs, as illustrated in the schematic diagram in FIG. 1, trimethylgallium (($CH_3)_3Ga$) and arsine flow from respective supply tanks 10 in amounts regulated by respective valves 12. Trimethylgallium is in fact a liquid, but its vapor is obtained by bubbling a gas such as $H_2$ through it. The gas flows combine through an unillustrated manifold into a common inlet port 14 to a generally illustrated reactor cell 16, which contains a graphite susceptor 18 on which is placed a wafer 20. The reactor cell 16 includes a main body wall 22, usually made of fused quartz and usually having a rectangular cross-section of the order of 15 cm$^2$. An RF coil 24 external to the cell 16 controllably heats the graphite susceptor 18 and hence the wafer 20.

The combined gases flow over the wafer surface, and the arsine reacts and the trimethylgallium cracks on the surface of the heated substrate 20 to provide the As and Ga, which combine at the substrate surface in the crystalline arrangement of the substrate 20. That is, they are epitaxially deposited. A pump 26 maintains the gas flow and exhausts the gas but keeps the interior of the cell 16 at a fixed pressure. For the growth of InP, trimethylindium (($CH_3)_3In$) and phosphine can be used as precursors. Small-scale OMCVD reactors and complete growth systems usable with the invention are commercially available from Thomas Swan & Co., Ltd. of the United Kingdom, Spire Corporation of Massachusetts, and Emcore Corporation of New Jersey, among others.

Although OMCVD has at least partially solved the problem of precursors, the problem of control of thickness has been solved only for large commercial OMCVD reactors. See, for example, "Aixtrons's Low-Pressure MOVPE: Concepts for Improved Quality and Safety," III-Vs Review, volume 4, number 2, 1991, pp. 1, 3, 32, and 33. The thickness-control problem remains unsolved for less expensive, smaller reactors, as has been discussed by Thrush et al. in "MOCVD grown InP/InGaAs structures for optical receivers," *Journal of Crystal Growth*, volume 93, 1988, pp. 870–876 and by van de Ven et al. in "Gas phase depletion and flow dynamics in horizontal MOVCD reactors," *Journal of Crystal Growth*, volume 76, 1986, pp. 352–372. For the deposition of very thin layers, the gas flow must be uniformly maintained over the area of the wafer 20.

The lateral flow has been improved in the prior art by a number of schemes. In a first approach illustrated in plan view in FIGS. 2 and 3, the relatively small cylindrical inlet port 14 is joined to the relatively large main body 22 of the cell 16 by a long taper section 30. The susceptor 18 is placed in a trough 32 so that the wafer surface is near the lower side of the interior of the taper section 30. Additionally, a wedge 34 may be placed in the taper section 30 to force additional flow to the sides. The deposition can be made more uniform in the direction of gas flow by tilting the susceptor 18 by about 7° about an axis perpendicular to the gas flow and with its surface toward the gas source so as to counter depletion of the reactants. The tilting can be accomplished by placing a fused quartz block 36 between the head of the trough 32 and the susceptor 18 so as to present a smooth surface over which the gas flows and then manually pushing a shim 38 to elevate the susceptor 18 to the desired angle. Additional uniformity can be obtained by a gas rotation technique in which the wafer 20 rests on a thin graphite disc disposed within the recess of the susceptor 18. A gas is externally supplied through channels in the susceptor 18 connected to a series of angularly offset nozzles in the recess to thereby continuously rotate the wafer 20 during the OMCVD deposition. In an alternative approach illustrated in FIGS. 4 and 5, a shower head 40 mostly fills the cross-section of the main body 22 of the cell 16. The head 40 contains a square array of holes 42 through which the gas flows with a significant pressure drop. Thereby, the gas is spread across the cell cross-section. Related approaches include baffles set in the gas flow.

Although the uniformity has been improved by these techniques, it has remained insufficient for advanced devices.

SUMMARY OF THE INVENTION

The invention may be summarized as a method and apparatus for chemical vapor growth in which a gas flow containing one or more chemical precursors of the material to be grown are injected into the reaction chamber at a right angle to the direction in which the gas flows over the substrate. Preferably, the combined gas flow abruptly turns several times prior to injection into the reaction chamber. If the substrate is tilted with respect to the initial gas flow, the injection direction is perpendicular to the axis about which the substrate is tilted. Thereby, the gas composition is uniformly mixed and the gas flows through the deposition chamber uniformly across its cross section.

BRIEF DESCRIPTION OF THE DRAWING

FIG. 2 is a plan view and FIG. 3 is a side cross-sectional view taken along the sectional line 3—3 of FIG. 2.

FIG. 4 is a side cross-sectional view and FIG. 5 is a combined plan and cross-sectional axial view taken along sectional line 5—5 of FIG. 4.

FIGS. 6, 7, and 8 illustrate a reactor cell of the invention. FIG. 6 is a longitudinal cross-section, FIG. 7 is a lateral cross-section taken along sectional line 7—7 of FIG. 6 and FIG. 8 is a top plan view taken along view line 8—8 of FIG. 6.

FIG. 9 is an illustration, partly schematic and partly in cross-section, of the reactor cell of the invention and several elements to which it is joined in an OMCVD growth apparatus.

DETAILED DESCRIPTION OF THE PREFERRED EMBODIMENT

Figure 1:
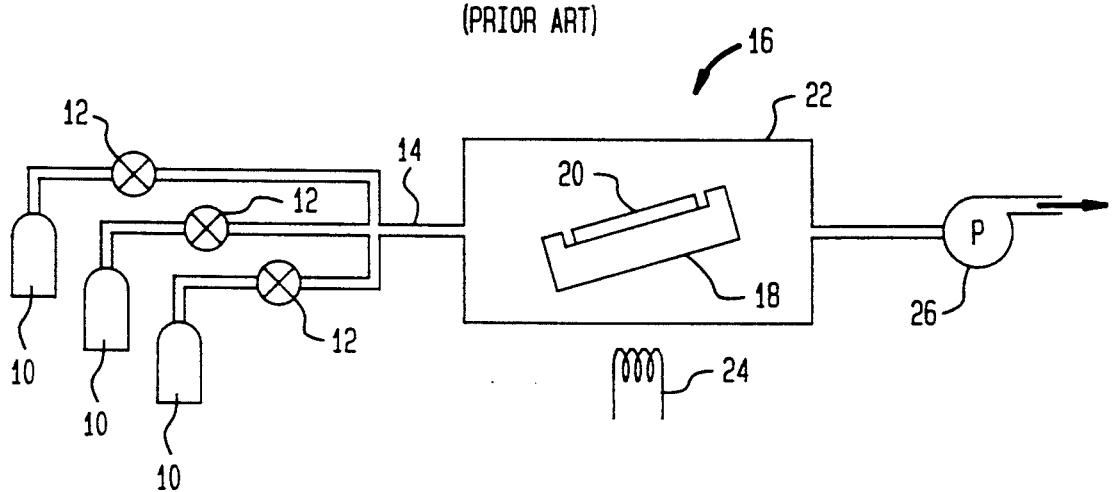
FIG. 1 generally illustrates an OMCVD apparatus for growing thin films.
Figure 5:
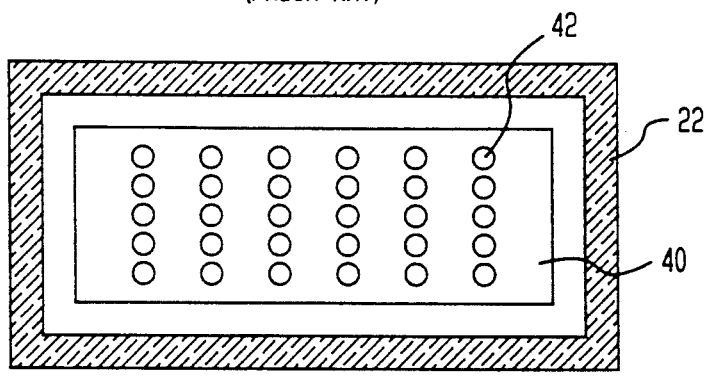
FIGS. 4 and 5 illustrate another prior-art approach.
Figure 2:
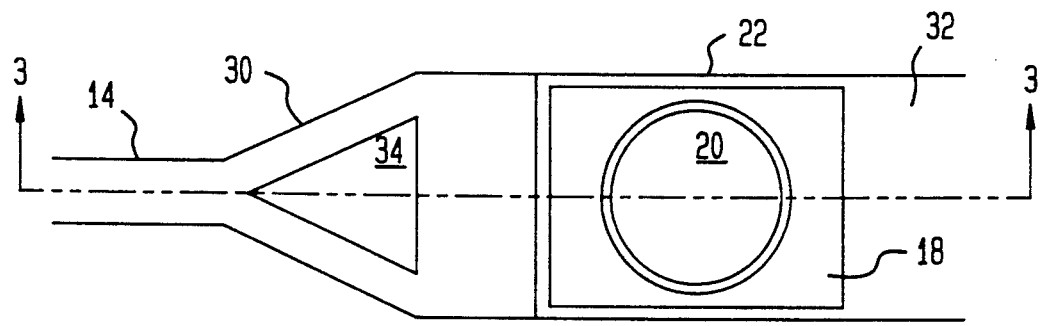
FIGS. 2 and 3 illustrate a prior-art approach for improving lateral uniformity in an OMCVD apparatus.
Figure 3:
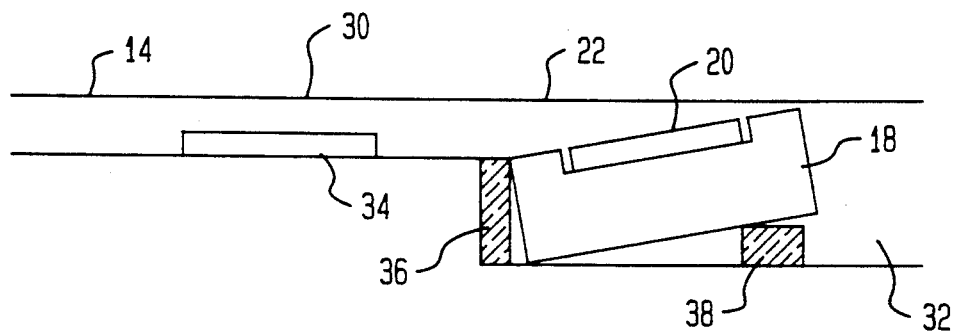
Figure 4:
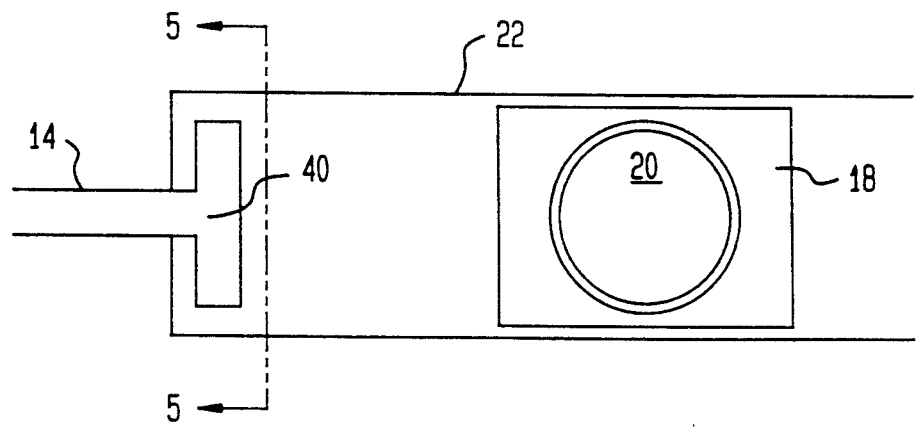

One embodiment of an insert part 52 of the reactor cell of the invention is illustrated in FIGS. 6, 7, and 8. The main body 22 of the insert 52 including the trough 32 has an internal rectangular cross section of about 1" by 2½" (2.54×6.35 cm). The walls of the rectangular sections are made of fused quartz with a thickness of about 5/64" (0.2 cm). The depth of the trough 32 below the lower interior wall of the taper section 30 is about 9/16" (1.4 cm) and its length is about 11" (28 cm).

The inlet port 14 is composed of a fused quartz cylindrical tube having an outside diameter of ½" (1.27 cm) and walls of thickness of 1 mm. Its outer end is formed into a socket 54 of a ball-and-socket joint. The inner end of the inlet port 14 is fused to a deflection section 56 consisting of an upward section 58, a horizontal section 60, and a downward section 61, each of which is about 1" (2.54 cm) long. The sections 58, 60, and 61 are composed of the previously described quartz tube and are joined to each other and to the inlet tube 14 in fused right-angle corners or joints 62, 64, and 66. The downward section 61 is joined to the rectangularly shaped taper section 30 in another fused right-angle joint 68. The joints 62–68 provide abrupt, right-angle corners in the sense that any radius of curvature of a corner is comparable to or preferably less than the diameter of the tube 14, 58, 60, or 61 leading into the corner. A fused quartz rod 70 fused to the lower ends of the upward and downward sections 58 and 61 mechanically supports the insert 52. The taper section 30 tapers laterally outwardly for about 6" (15.2 cm) between the downward section 61 and the main body 22. Its interior vertical dimension of approximately 10 mm does not vary significantly, and its internal width at its narrow end matches the internal diameter of the tube 61 to which it is joined. The inlet tube 14 is axially aligned with the upper portion of the main body 22, and the socket 54 is separated from the main body 22 by about 11" (21 mm) so that the inventive insert 52 is compatible with present commercial parts.

The deflection section 56 of the invention requires that the gas undergoes four sharp turns at the four right-angle joints 62 through 68 before it reaches the main body 22. At each turn, any possibility of laminar flow of the gas is destroyed, thereby assuring turbulent mixing of the gas. The perpendicular joint 68 to the taper section 30 results in the rapid spreading of the gas to the full width of the reactor and hence uniform deposition. Thus, the gas in made more uniform and any tendency for the gas to flow mainly down the middle of the main body 22 is reduced.

An alternative deflection section has been tested which had only one right-angle joint 68 together with a gently curving goose neck. It produced better uniformity than the prior art but less than that produced by the apparatus of FIGS. 6 through 8.

It is often desirable to operate the OMCVD reactor at internal pressures substantially below atmospheric pressure although above the ultra-high vacuum of MBE, for example, at 76 torr. Such a pressure differential is likely to stress and crack the rectangularly shaped main body 22 and taper section 30. Therefore, the insert 52 is placed inside a cylindrical jacket 80, illustrated schematically in cross section in FIG. 9. The jacket 80 is composed of fused quartz and has on its left side a generally hemispherical end including an aperture for loosely fitting a quartz OMCVD gas supply tube 82 with a ball 84 having an axial passage and being engagable with the socket 54. The insert 52 is supported within the cylindrical jacket 80 by two legs 86 and 88 having correspondingly cylindrically shaped lower edges, as shown in FIG. 7. The insert 52 can be easily slid along the inside of the jacket 80 into and out of contact with the ball 84 by use of a hook 90 in the outer leg 88. A supply tube 92 for supplying gas for flushing and cooling is formed in the hemispherical end wall on the side radially opposite the deflection section 56.

A quartz trumpet 94 loosely fits the inside of the cylindrical jacket 80 and has at the center of its flange 96 a central aperture of 15 mm diameter connecting to a pumping tube 98, which is connected to the pump 26. After the susceptor 18 and wafer 20 have been loaded into the insert 52, the trumpet 94 is pushed to the left until its flange 96 comes into continuous loose contact with the right end of the insert 52. Thereby, the pump 26 pumps the interiors of both the insert 52 and the jacket 80. Additional unillustrated means may be provided in the flange 96 for the gas supply for the previously described gas rotator incorporated into the susceptor 18.

Using the apparatus of FIG. 9 and a tilted susceptor, my colleagues and I have have deposited epitaxial films with a thickness uniformity of ±1.5% over an area of 40 mm diameter on a 50 mm diameter InP substrate. Wafer rotation is expected to further improve the uniformity. Furthermore, the compositional uniformity was found to greatly improve. For example, the variation in bandgap wavelength for an InGaAsP quaternary alloy of nominal 1 μm wavelength was ±1.5 nm over the 40 mm diameter. The wavelength variation was much reduced from that reported by Thrush et al.

The invention allows for greatly improved uniformity of deposited CVD films and is particularly useful for advanced compound-semiconductor devices fabricated by OMCVD. The apparatus is nonetheless relatively simple and inexpensive and can be easily integrated with existing growth apparatus.

What is claimed is:

1. In a reactor cell for use in a chemical vapor deposition system and having
    a deposition chamber for holding a substrate for chemical vapor deposition thereupon from a gas flowing through said chamber substantially along a gas flow axis extending along a median of said deposition chamber while said substrate is held within said chamber with a normal of its principal face being inclined to said axis at a substantially non-zero angle and
    an input port for supplying said gas, the improvement comprising
    means interposed between said input port and said deposition chamber for uniformly mixing the gas composition whereby the gas flows through the deposition chamber uniformly across its cross section, said means comprising a deflection section having a plurality of right angle corners through which said gas flows between said input port and said deposition chamber so that the gas is injected into the deposition chamber perpendicular to and onto said gas flow axis.

2. In a reactor cell, the improvement recited in claim 1 wherein said deflection section has four right angle corners through which said gas flows between said input port and said deposition chamber.

3. In a reactor cell, the improvement as recited in claim 2, further comprising a taper section outwardly tapering from said deflection section to said deposition chamber.

4. In a reactor cell, the improvement as recited in claim 3, wherein said taper section has a substantially rectangular cross-section outwardly tapering in a first direction and of substantially constant dimension in a perpendicular second direction.

* * * * *